United States Patent
Mori

(10) Patent No.: US 7,087,487 B2
(45) Date of Patent: *Aug. 8, 2006

(54) METHOD FOR FABRICATING NONVOLATILE MEMORY DEVICE AND METHOD FOR FABRICATING SEMICONDUCTOR DEVICE

(75) Inventor: Katsumi Mori, Sakata (JP)

(73) Assignee: Seiko Epson Corporation (JP)

( * ) Notice: Subject to any disclaimer, the term of this patent is extended or adjusted under 35 U.S.C. 154(b) by 455 days.

This patent is subject to a terminal disclaimer.

(21) Appl. No.: 10/378,589

(22) Filed: Mar. 3, 2003

(65) Prior Publication Data

US 2003/0181000 A1 Sep. 25, 2003

(30) Foreign Application Priority Data

Mar. 5, 2002 (JP) ......................................... 2002-059146

(51) Int. Cl.
*H01L 21/336* (2006.01)

(52) U.S. Cl. ...................................... 438/257; 438/954

(58) Field of Classification Search ................ 438/257, 438/258, 259, 260, 261, 262, 266, 267, 733, 438/738, 740, 692, 954
See application file for complete search history.

(56) References Cited

U.S. PATENT DOCUMENTS

| 5,408,115 | A |  | 4/1995 | Chang |
|---|---|---|---|---|
| 5,422,504 | A |  | 6/1995 | Chang et al. |
| 5,494,838 | A |  | 2/1996 | Chang et al. |
| 5,969,383 | A |  | 10/1999 | Chang et al. |
| 6,177,318 | B1 |  | 1/2001 | Ogura et al. |
| 6,191,441 | B1 | * | 2/2001 | Aoki ........................... 257/295 |
| 6,248,633 | B1 |  | 6/2001 | Ogura et al. |
| 6,255,166 | B1 | * | 7/2001 | Ogura et al. ................. 438/257 |
| 6,413,821 | B1 | * | 7/2002 | Ebina et al. ................. 438/257 |
| 6,518,124 | B1 | * | 2/2003 | Ebina et al. ................. 438/257 |
| 6,531,350 | B1 | * | 3/2003 | Satoh ........................... 438/197 |

(Continued)

FOREIGN PATENT DOCUMENTS

| JP | 7-161851 | 6/1995 |
|---|---|---|
| JP | 2978477 | 9/1999 |
| JP | 2001-156188 | 6/2001 |

OTHER PUBLICATIONS

Chen, et al., "A Novel Flash Memory Device with S Plit Gate Source Side Injection and ONO Charge Storage Stack (SPIN)," 1997 Symposium on VLSI Technology Digest of Technical Papers, pp. 63–64.

Chang, et al., "A New SONOS Memory Using Source–Side Injection for Programming," IEEE Electron Device Letters, vol. 19, No. 7, Jul. 1998, pp. 253–255.

Hayashi, et al., "Twin MONOS Cell with Dual Control Gates," 2000 Symposium on VLSI Technology Digest of Technical Papers (2 pages).

*Primary Examiner*—David Nhu
(74) *Attorney, Agent, or Firm*—Harness, Dickey & Pierce, P.L.C.

(57) ABSTRACT

A method, for fabricating a semiconductor device including a memory region and a logic circuit region including a periphery circuit, includes: forming sidewall-like control gates on both side surfaces of a first conductive layer at least in a memory region with an ONO film interposed therebetween, respectively; patterning a first conductive layer in a logic circuit region and thereby forming a gate electrode of a MOS transistor; forming a second insulating layer above the control gates; applying anisotropic etching to the second insulating layer, and thereby at least partially exposing the control gates; and on the exposed surfaces of the control gates, forming a silicide layer.

7 Claims, 18 Drawing Sheets

U.S. PATENT DOCUMENTS

2002/0100929 A1   8/2002  Ebina et al.
2002/0127805 A1   9/2002  Ebina et al.
2003/0054610 A1   3/2003  Ebina et al.
2003/0057505 A1   3/2003  Ebina et al.
2003/0058705 A1   3/2003  Ebina et al.
2003/0060011 A1   3/2003  Ebina et al.

* cited by examiner

METHOD FOR FABRICATING NONVOLATILE MEMORY DEVICE AND METHOD FOR FABRICATING SEMICONDUCTOR DEVICE

TECHNICAL FIELD

The present invention relates to a method for fabricating a nonvolatile memory device and a method for fabricating a semiconductor device including the nonvolatile memory device, in particular, to a method for fabricating a nonvolatile memory device having a plurality of charge storage regions for one word gate and a method for fabricating a semiconductor device including the nonvolatile memory device.

BACKGROUND

As one type of nonvolatile memory devices, there is a type called a MONOS (Metal Oxide Nitride Oxide Semiconductor) type or SONOS (Silicon Oxide Nitride Oxide Silicon) type in which a gate insulating layer between a channel region and a control gate is made of a laminate body of a silicon oxide layer/a silicon nitride layer/a silicon oxide layer, and the silicon nitride layer traps electric charges.

As a MONOS type nonvolatile semiconductor memory device, a device shown in FIG. 18 is known (Y. Hayashi, et al, 2000 Symposium on VLSI Technology Digest of Technical Papers, p.122–p.123).

A MONOS type memory cell 100 is provided with a word gate 14 on a semiconductor substrate 10 with a first gate insulating layer 12 interposed therebetween. On both sides of the word gate 14, sidewall-like first control gate 20 and second control gate 30 are disposed, respectively. Between a bottom portion of the first control gate 20 and the semiconductor substrate 10, there is disposed a second gate insulating layer 22, and between a side surface of the first control gate 20 and the word gate 14, there is an insulating layer 24. Similarly, between a bottom portion of the second control gate 30 and the semiconductor substrate 10, there is disposed a second gate insulating layer 22, and between a side surface of the second control gate 30 and the word gate 14, there is disposed an insulating layer 24. In addition, on the semiconductor substrate 10 between the control gate 20 and the control gate 30, of adjacent memory cells (no interposed word gate 14), an impurity region 16, 18 that constitutes a source region or a drain region is formed.

Thus, one memory cell 100 has two MONOS type memory elements on side surfaces of the word gate 14. Furthermore, these two MONOS type memory elements can be independently controlled. Accordingly, one memory cell 100 can memorize 2-bit information.

SUMMARY

Embodiments of the present invention provide: methods for fabricating a MONOS-type nonvolatile memory device having a plurality of charge storage regions; methods for fabricating a semiconductor device including the nonvolatile memory device; and the resulting devices respectively.

An embodiment of the invention provides a method for fabricating a nonvolatile memory device, comprising: forming a first insulating layer above a semiconductor layer; forming a first conductive layer above the first insulating layer; forming a stopper layer above the first conductive layer; patterning the stopper layer and the first conductive layer; forming an ONO film above the semiconductor layer and on both side surfaces of the first conductive layer; forming a second conductive layer above the ONO film; etching back the second conductive layer using an anisotropic etching, and thereby forming a sidewall-like control gate on both side surfaces of the first conductive layer with the ONO film interposed therebetween: forming a second insulating layer above the control gate; etching back the second insulating layer using an anisotropic etching, and thereby at least partially exposing the control gate; forming an impurity region to be a source region or a drain region in the semiconductor layer; forming a silicide layer on a surface of the impurity region and an exposed surface of the control gate; forming a third insulating layer over an entire surface; polishing the third insulating layer so as to expose the stopper layer; removing the stopper layer; and patterning the first conductive layer and thereby forming a word gate.

Another embodiment of the invention provides a method for fabricating a semiconductor device including a memory region including a nonvolatile memory device; and a logic circuit region including a peripheral circuit of the nonvolatile memory device, comprising: forming a first insulating layer above a semiconductor layer; forming a first conductive layer above the first insulating layer; forming a stopper layer above the first conductive layer; patterning the stopper layer and the first conductive layer in the memory region; forming an ONO film above the semiconductor layer and on both side surfaces of the first conductive layer in the memory region; forming a second conductive layer above the ONO film; etching back the second conductive layer using an anisotropic etching, and thereby forming a sidewall-like control gate at least on both side surfaces of the first conductive layer in the memory region with the ONO film interposed therebetween; removing the stopper layer in the logic circuit region; patterning the first conductive layer in the logic circuit region, and thereby forming a gate electrode of an insulated gate field effect transistor in the logic circuit region; forming a second insulating layer over an entire surface; etching back the second insulating layer using an anisotropic etching, and thereby at least partially exposing the control gate; etching back the second insulating layer using an anisotropic etching, and thereby forming a sidewall insulating layer at least on both side surfaces of the gate electrode; forming a first impurity region to be a source region or a drain region of the nonvolatile memory device, and a second impurity region to be a source region or a drain region of the insulated gate field effect transistor; forming a silicide layer on a surface of the first and second impurity regions, a surface of the gate electrode, and an exposed surface of the control gate; forming a third insulating layer over an entire surface of the memory region and the logic circuit region; polishing the third insulating layer so that the stopper layer in the memory region is exposed and the gate electrode in the logic circuit region is not exposed; removing the stopper layer in the memory region; and patterning the first conductive layer in the memory region, and thereby forming a word gate of the nonvolatile memory device in the memory region.

Additional features and advantages of the invention will be more fully apparent from the following detailed description of example embodiments, the appended claims and the accompanying drawings.

The accompanying drawings are: intended to depict example embodiments of the invention and should not be interpreted to limit the scope thereof; and not to be considered as drawn to scale unless explicitly noted.

DETAILED DESCRIPTION

Semiconductor Device Structure

Figure 1:
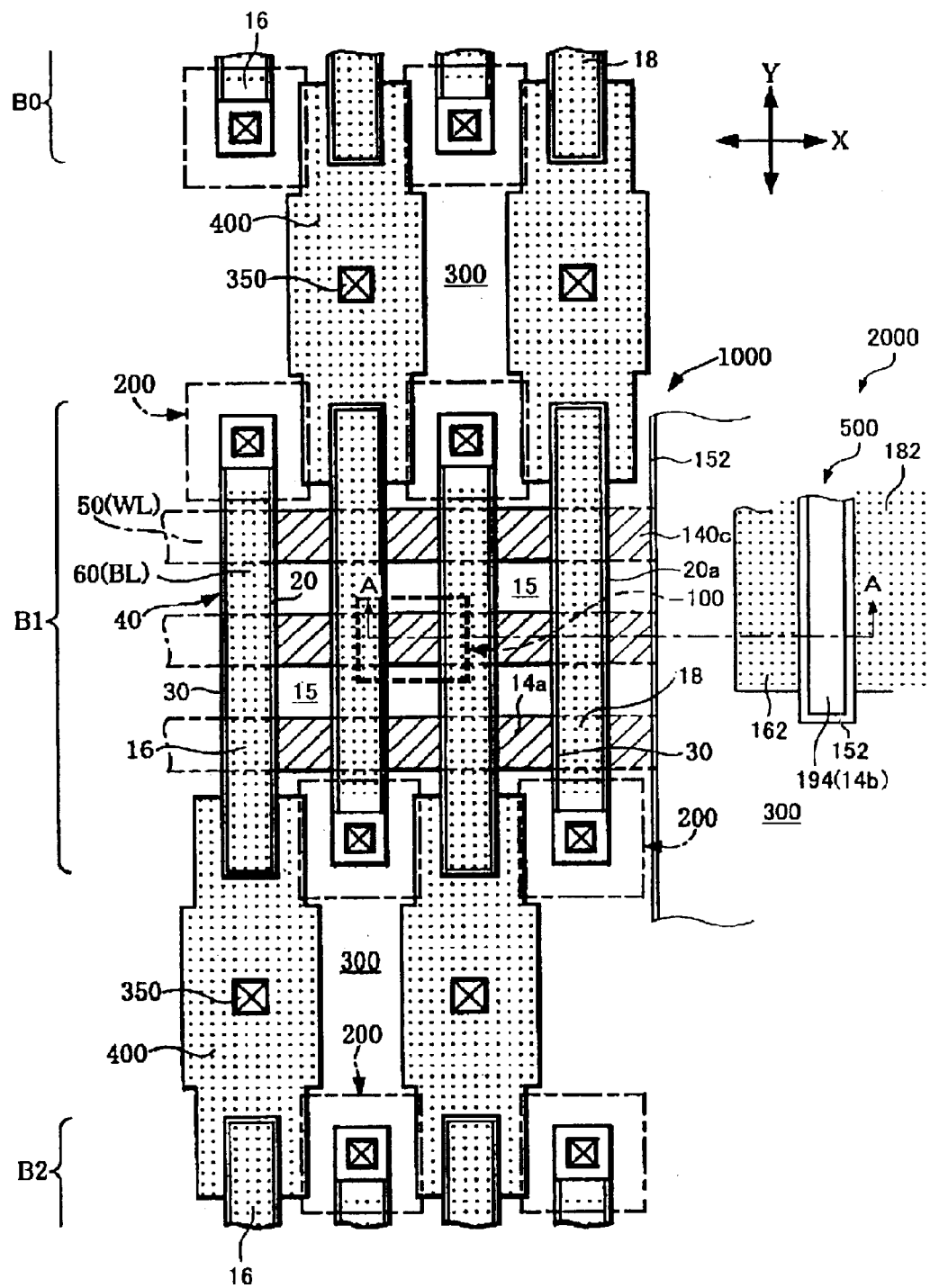
FIG. 1 is a plan view schematically showing a layout of a semiconductor device according to an embodiment of the present invention.

FIG. 1 is a plan view showing a layout of a semiconductor device according to an embodiment of the present invention obtained using a fabricating method according to another embodiment of the present invention. The semiconductor device includes a memory region 1000 and a logic circuit region 2000. In the logic circuit region 2000, for instance, a periphery circuit of a memory is formed.

In the memory region 1000, MONOS-type nonvolatile memory devices (hereinafter referred to as "memory cells") 100 are arranged in a plurality of columns and rows in lattice. In the memory region 1000, a first block B1 and part of other blocks B0 and B2 that are adjacent to the first block B1 are shown. The blocks B0 and B2 have a configuration that is obtained by reversing the block B1.

Partially in a region between the block B1 and each of the adjacent blocks B0 and B2, an element isolation region 300 is formed. In each of the blocks, a plurality of word lines 50 (WL) extending in an X direction (row direction), and a plurality of bit lines 60 (BL) extending in a Y direction (column direction) are disposed. One word line 50 is connected to a plurality of word gates 14a arranged in an X direction. The bit line 60 includes of an impurity region 16, 18.

A conductive layer 40 that includes the first and second control gates 20 and 30 is formed so as to surround each of the impurity regions 16 and 18. That is, the first and second control gates 20 and 30 extend in a Y direction, and one ends of a pair of the first and second control gates 20 and 30 are connected to each other with a conductive layer extending in an X direction. Furthermore, the other ends of the pair of the first and second control gates 20 and 30 are together connected to a common contact portion 200. Accordingly, the conductive layer 40 functions as a control gate of a memory cell and functions as wiring connecting the respective control gates arranged in a Y direction.

A single memory cell 100 includes one word gate 14a, first and second control gates 20 and 30, and impurity regions 16 and 18. The first and second control gates 20 and 30 are formed on both sides of the word gate 14a. The impurity regions 16 and 18 are formed outside of the control gates 20 and 30. Each of the impurity regions 16 and 18 is shared between adjacent memory cells 100.

The impurity region 16 formed in the block B1 and the impurity region 16 formed in the block B2 are adjacent to each other in a Y direction are electrically connected to each other with a contact impurity region 400 formed inside of the semiconductor substrate 10. The contact impurity region 400 is located on a side opposite to the common contact portion 200 of the control gate with respect to the impurity region 16.

On the contact impurity region 400, a contact 350 is formed. The bit line 60 (again, including the impurity region 16) is electrically connected to a wiring layer in an upper layer with the contact 350.

Similarly, the impurity region 18 formed in the block B1 and the impurity region 18 formed in the block B0 are adjacent to each other in a Y direction are electrically connected to each other with another contact impurity region 400. The contact impurity region 400 is located on a side opposite to the common contact portion 200 of the control gate with respect to the impurity layer 18. As is apparent from FIG. 1, in a plan layout of one block, a plurality of common contact portions 200 is formed alternately on different sides between the impurity regions 16 and the impurity regions 18, resulting in a staggered lattice. Furthermore, in a plan layout with respect to one block, a plurality of the contact impurity layers 400 is formed alternately on different sides between the impurity regions 16 and the impurity regions 18, resulting in a staggered lattice.

In the logic circuit region 2000, at least an insulated gate field effect transistor (hereinafter referred to as "MOS transistor") 500 (included as at least part of the logic circuit region 2000) is formed. The MOS transistor 500 includes a gate electrode 14b, impurity regions 162 and 182 and sidewall insulating layers 152. On a top surface of the gate electrode 14b, a silicide layer 194 is formed.

Figure 2:
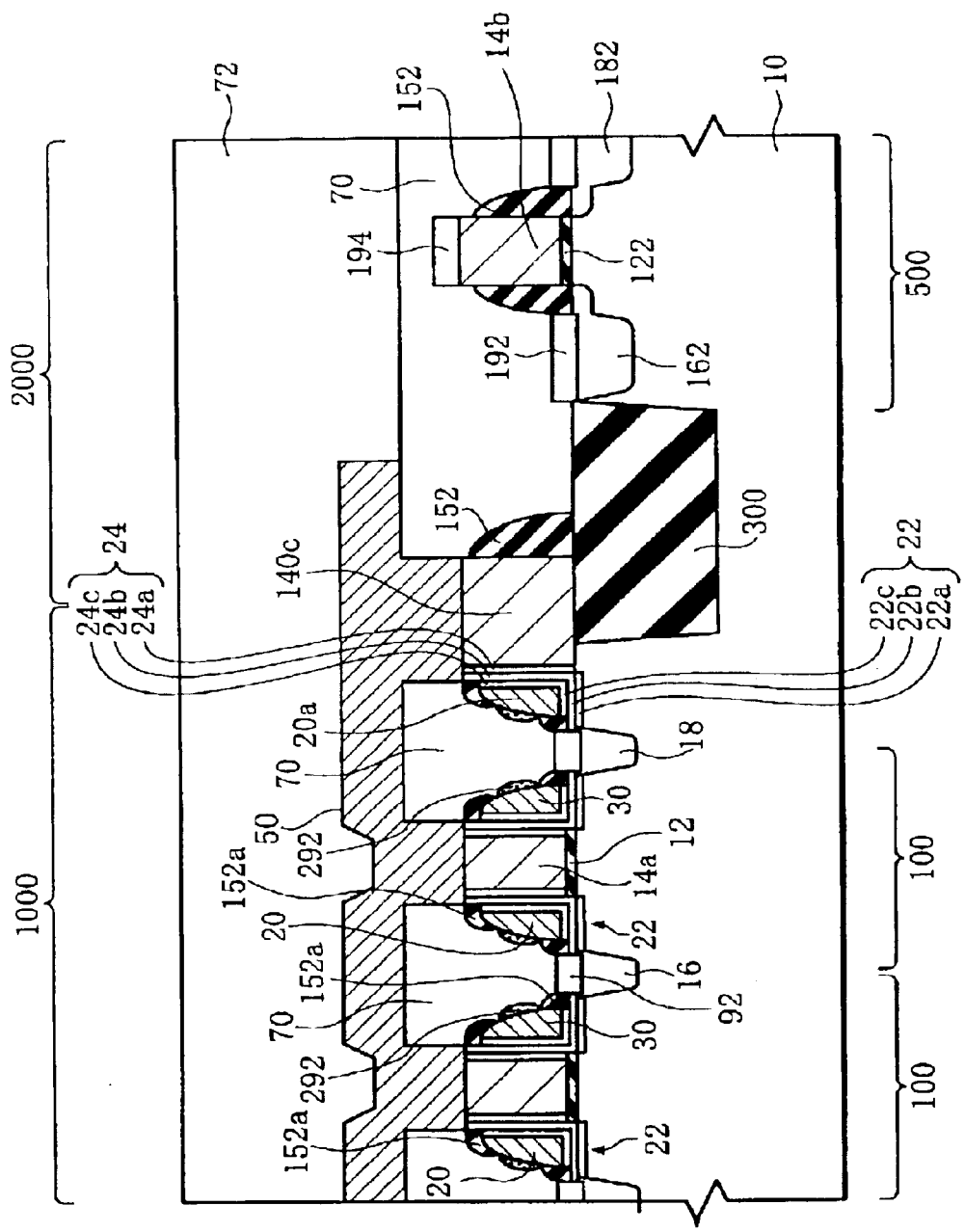
FIG. 2 is a cross sectional view schematically showing a portion along an A—A line of FIG. 1.

Next, with reference to FIG. 2, cross sectional structures of the semiconductor device of FIG. 1 will be explained. FIG. 2 is a cross sectional view along an A—A line of FIG. 1.

First, the memory region 1000 will be explained. The memory cell 100 includes a word gate 14a, impurity regions 16 and 18, a first control gate 20 and a second control gate 30. The word gate 14a is formed above a semiconductor substrate 10 on a first gate insulating layer 12 interposed therebetween. The impurity regions 16 and 18 are formed inside of the semiconductor substrate 10. Each of the impurity regions 16 and 18 becomes a source region or a drain region. Furthermore, on each of the impurity regions 16 and 18, a silicide layer 92 is formed.

The first and second control gates 20 and 30, respectively, are formed along both sides of the word gate 14*a*. The first control gate 20 is formed above the semiconductor substrate 10 with a second gate insulating layer 22 interposed therebetween and on one side surface of the word gate 14*a* with a side insulating layer 24 interposed therebetween. Similarly, the second control gate 30 is formed above the semiconductor substrate 10 with the second gate insulating layer 22 interposed therebetween and on the other side surface of the word gate 14*a* with a side insulating layer 24 interposed therebetween. A sectional shape of each of the control gates becomes similar to a cross sectional structure of a sidewall insulating layer in an existing MOS transistor.

Here, in the first and second control gates 20 and 30, attention is paid on surfaces that do not face the semiconductor substrate 10 and the word gate 14*a*. At least partially on the surfaces, a silicide layer 292 is formed. Thereby, resistance of the control gates 20 and 30 can be reduced. Furthermore, in the neighborhood above the impurity diffusion layers 16 and 18 and aside an upper level and a lower level of the word gate 14*a*, portions of an insulating layer 152*a* are formed. More particularly, it is above a top end and below a bottom end of the silicide layer 292 that portions of the insulating layer 152*a* are formed. In other words, the portions of the insulating layer 152*a* formed below the lower end of the silicide layer 292 can electrically insulate the silicide layer 292 from the silicide layer 92 formed on the impurity diffusion layer 16 or 18. Furthermore, the portions of the insulating layer 152*a* formed above the upper end of the silicide layer 292 can electrically insulate the silicide layer 292 from the word gate 14*a*. Thereby, a potential different from that of the word gate 14*a* and the impurity diffusion layers 16 and 18 can be supplied to the control gates 20 and 30. The insulating layer 152*a* can be formed in the same process as that of the sidewall insulating layer 152 of a MOS transistor 500 later described.

The second gate insulating layer 22 can be an ONO film. Specifically, the second gate insulating layer 22 is a laminate film of, e.g., a bottom silicon oxide layer (first silicon oxide layer) 22*a*, a silicon nitride layer 22*b*, and a top silicon oxide layer (second silicon oxide layer) 22*c*.

The first silicon oxide layer 22*a* forms a potential barrier between a channel region and a charge storage region.

The silicon nitride layer 22*b* functions as a charge storage region that traps a carrier (for instance, electrons).

The second silicon oxide layer 22*c* forms a potential barrier between a control gate and the charge storage region.

The side insulating layer 24 can be an ONO film. Specifically, the side insulating layer 24 is a laminate film of, e.g., a first silicon oxide layer 24*a*, a silicon nitride layer 24*b* and a second silicon oxide layer 24*c*. The side insulating layer 24 electrically separates the word gate 14*a* from each of the control gates 20 and 30. Furthermore, in the side insulating layer 24, at least, the top end of the first silicon oxide layer 24*a* is disposed at an upper position than those (that is extends upward beyond) of top ends of the control gates 20 and 30 with respect to the semiconductor substrate 10 in order, e.g., to inhibit the short circuit from occurring between the word gate 14*a* and each of the first and second control gates 20 and 30.

The side insulating layer 24 and the second gate insulating layer 22 can be formed in the same deposition process. Accordingly, layer structures thereof can be the same.

In adjacent memory cells 100, between the first control gate 20 and second control gate 30 that are adjacent to each other, a third insulating layer 70 is formed. The third insulating layer 70 covers the control gates 20 and 30 so that at least these may not be exposed. Furthermore, a top surface of the third insulating layer 70 is positioned higher than a top surface of the word gate 14*a* with respect to the semiconductor substrate 10. When the third insulating layer 70 is thus formed, the first and second control gates 20 and 30 can be more assuredly electrically separated from the word gate 14*a* and the word line 50.

In the logic circuit region 2000, a MOS transistor 500 is formed. A gate electrode 14*b* is formed above the semiconductor substrate 10 with a third insulating layer 122 interposed therebetween. On a top surface of the gate electrode 14*b*, a silicide layer 194 is formed. Impurity regions 162 and 182 are formed inside of the semiconductor substrate 10. Each of the impurity regions becomes a source region or a drain region. Furthermore, on each of the impurity regions 162 and 182, a silicide layer 192 is formed.

A sidewall insulating layer 152 is formed along both side surfaces of the gate electrode 14*b*.

In the logic circuit region 2000, the MOS transistor 500 is covered with the third insulating layer 70.

In a boundary region between the memory region 1000 and the logic circuit region 2000, as shown in FIGS. 1 and 2, a boundary portion 140*c* (e.g., made of the same material as the word gate 14*a* and the gate electrode 14*b*) is formed. On one side surface (memory region 1000 side) of the boundary portion 140*c*, a sidewall-like conductive layer 20*a* (e.g., made of the same material as the control gates 20 and 30) is formed. Furthermore, on the other side (logic circuit region 2000 side) of the boundary portion 140*c*, a sidewall-like insulating layer 152 (e.g., formed in the same process as that of the sidewall insulating layer 152 of the MOS transistor 500) is formed. On the semiconductor substrate 10, the memory cells 100, the MOS transistor 500, and an interlayer insulating layer 72 are formed.

Semiconductor Device Fabrication

Next, with reference to FIGS. 3 through 17, a method of fabricating a semiconductor device according to an embodiment of the present will be explained. All the cross sectional views correspond to portions along an A—A line in FIG. 1. In FIGS. 3 through 17, the same portions substantially as the portions shown in FIGS. 1 and 2 are given the same reference numerals, and repeating explanations thereof will be omitted.

Figure 3:
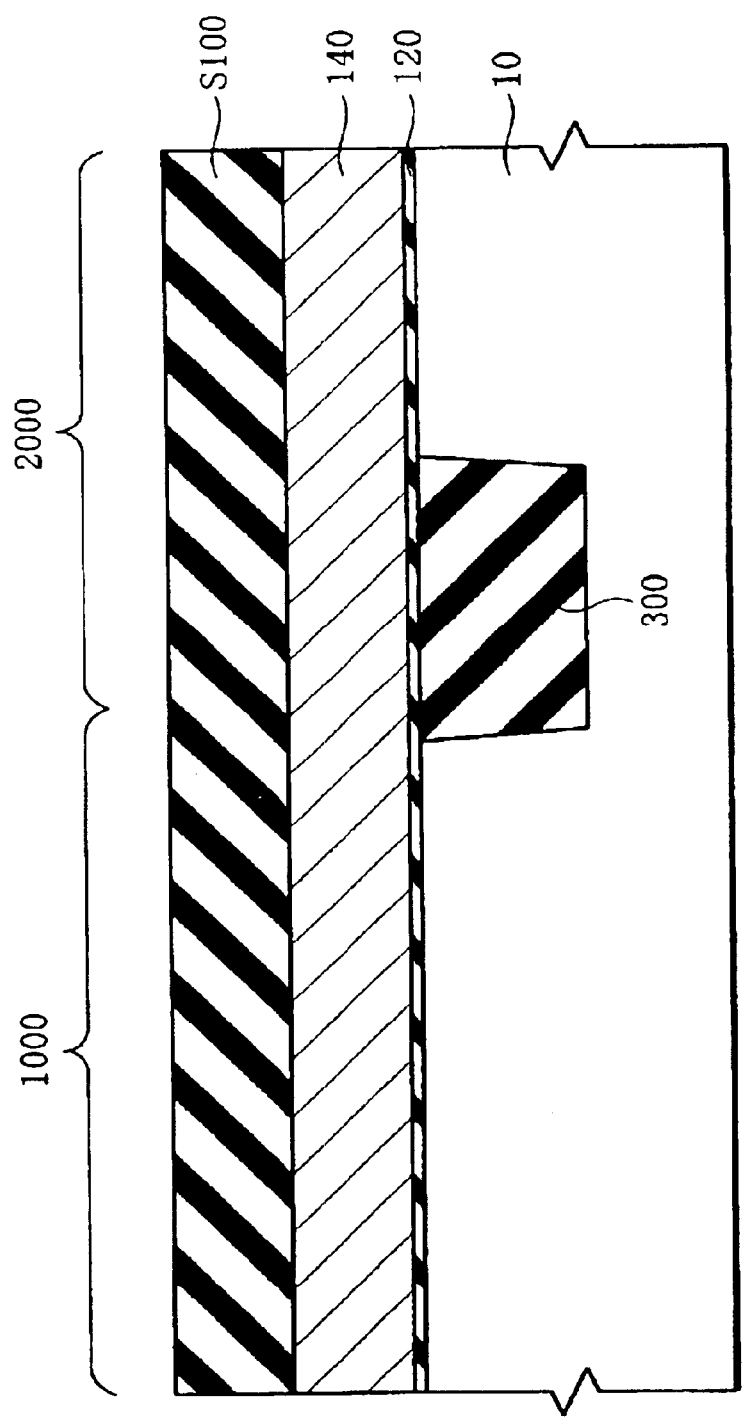
FIG. 3 is a diagram showing a process according to one embodiment of the present invention.

As shown in FIG. 3, first, on a surface of a semiconductor substrate 10 (e.g., according to a trench isolation method), an element isolation region 300 is formed. Subsequently, e.g., by ion implantation, a contact impurity, e.g., N type, region 400 (FIG. 1) is formed inside of the semiconductor substrate 10.

Subsequently, on the surface of the semiconductor substrate 10, an insulating layer 120 to be a gate insulating layer is formed. Then, a gate layer (first conductive layer) 140 to be a word gate 14*a* and a gate electrode 14*b* is deposited on the insulating layer 120. The gate layer 140 is made of, e.g., doped polysilicon. Then, a stopper layer S100, e.g., for the later CMP process is formed on the gate layer 140. The stopper layer S100 is made of, e.g., a silicon nitride layer.

Figure 4:
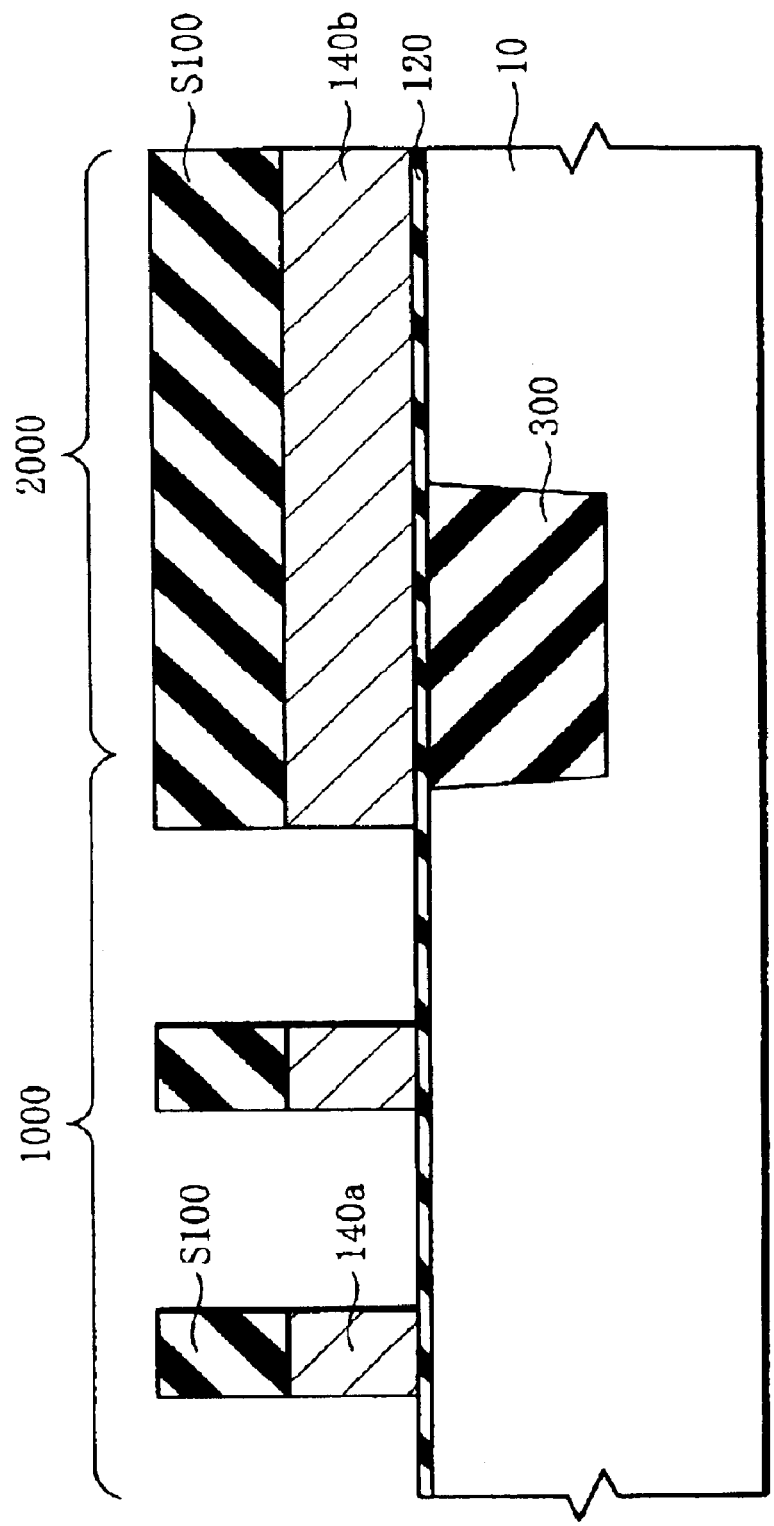
FIG. 4 is a diagram showing a process according to one embodiment of the present invention.

Next, a resist layer (not shown) that covers an entire logic circuit region 2000 and partially extends to the memory region 1000 is formed. Subsequently, with the resist layer as a mask, the stopper layer S100 is patterned. Thereafter, with the patterned stopper layer as a mask, the gate layer 140 is etched. As shown in FIG. 4, in the memory region 1000, the gate layer 140 is patterned into a gate layer 140*a*. On the other hand, in this process, the gate layer 140 in the logic circuit region 2000 is not patterned (hereinafter the gate layer 140 in the logic circuit region is called as 140b).

Figure 5:
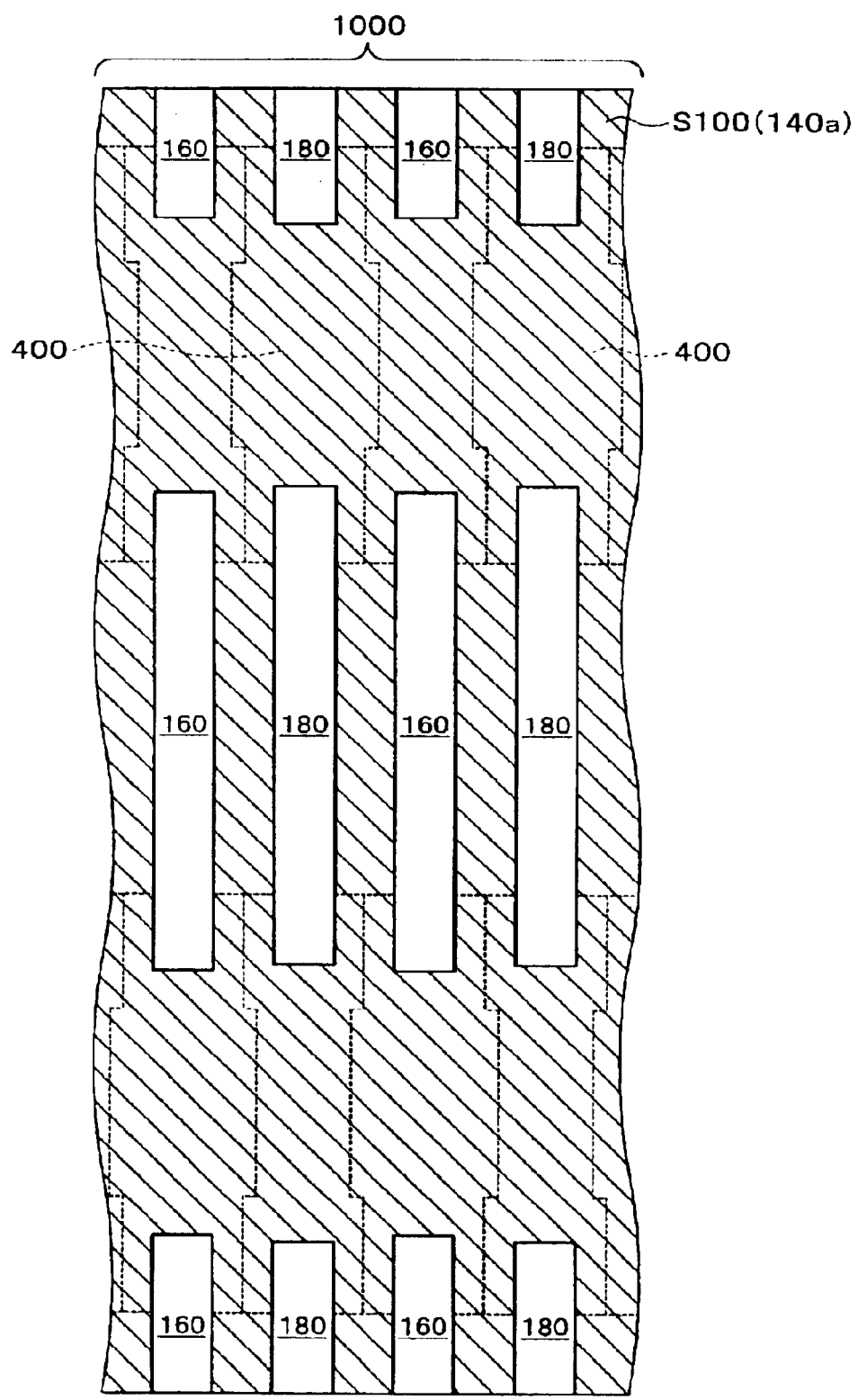
FIG. 5 is a diagram showing a process according to one embodiment of the present invention.

FIG. 5 shows a plan view after the patterning. Because of the patterning, a laminated body of the gate layer 140 and the stopper layer S100 in the memory region 1000 is provided with openings 160 and 180. The openings 160 and 180 substantially correspond to regions where impurity regions 16 and 18 are later formed by use of the ion implantation. In later processes, the side insulating layers and the control gates are formed along side surfaces of the openings 160 and 180.

Figure 6:
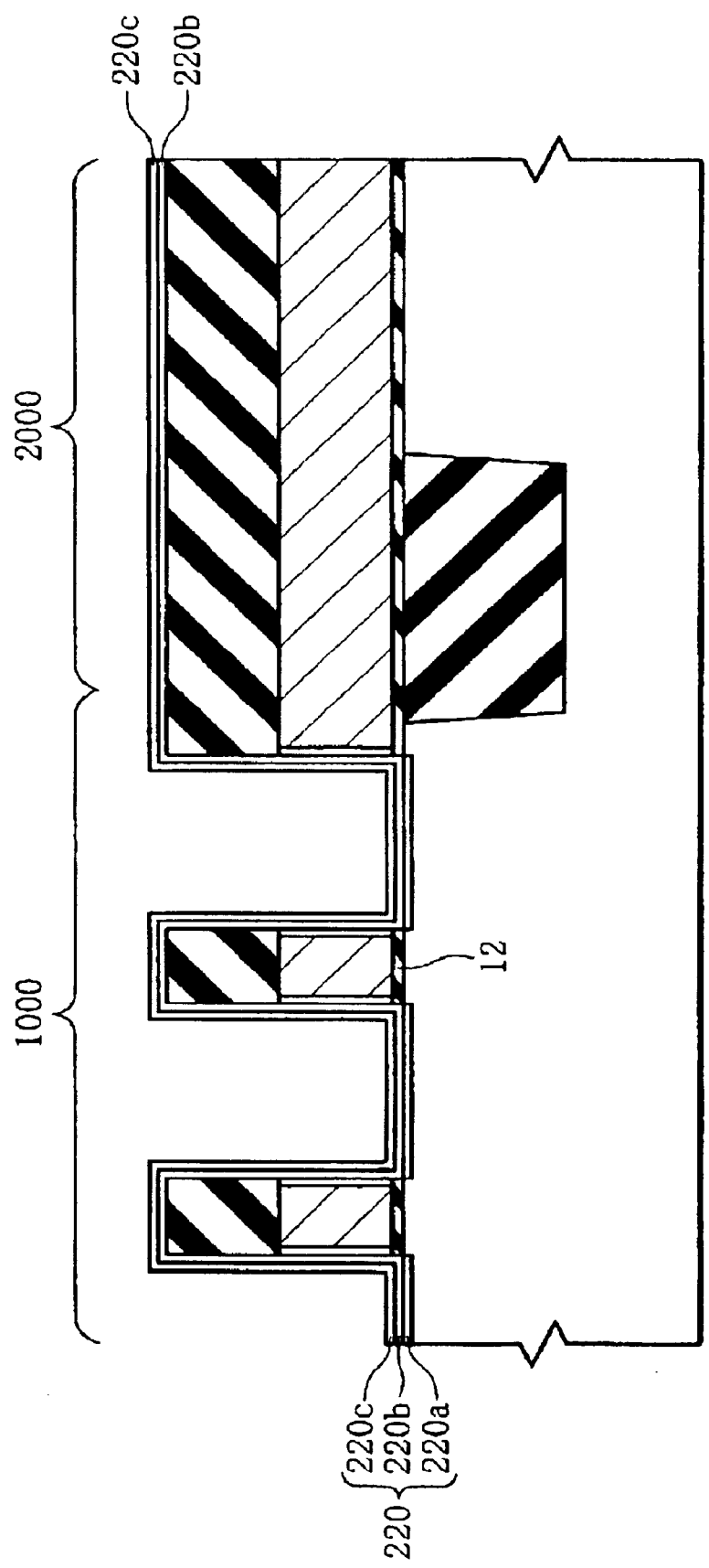
FIG. 6 is a diagram showing a process according to one embodiment of the present invention.

First, a surface of the semiconductor substrate is cleaned with, e.g., hydrofluoric acid. Thereby, an exposed insulating layer 120 is removed. Subsequently, as shown in FIG. 6, a first silicon oxide layer 220a is formed, e.g., via a thermal oxidation method. A thermal oxidation film is formed on an exposed surface of the semiconductor substrate 10 and the gate layers 140a and 140b. The first silicon oxide layer 220a may be formed by use of, e.g., a CVD method.

Next, the first silicon oxide layer 220a is annealed. This annealing is applied in an atmosphere including, e.g., a $NH_3$ gas. Because of this pre-treatment, on the first silicon oxide layer 220a, a silicon nitride layer 220b can easily be deposited uniformly. Thereafter, the silicon nitride layer 220b is deposited by use of a CVD method.

Subsequently, the second silicon oxide layer 220c is formed by use of, e.g., a CVD method, specifically such as a high temperature low-pressure CVD or a RTCVD (Rapid Thermal Chemical Vapor Deposition).

In the above process, when the silicon nitride layer 220b and the second silicon oxide layer 220c are deposited consecutively in the same furnace, the interface thereof can be prevented from being contaminated due to eliminating a need for intervening removal from the furnace. Since thereby a uniform ONO film can be formed, a memory cell 100 having stable electrical characteristics can be obtained. Furthermore, since a cleaning process for removing the contamination at the interface becomes unnecessary, the number of processes can be reduced.

After these individual layers are deposited, annealing treatment with, e.g., a furnace or RTO apparatus is preferably applied to densify the individual layers.

In this embodiment, the ONO film 220, when patterned in a later process, becomes the second gate insulating layer 22 and the side insulating layer 24 (FIG. 2).

Figure 7:
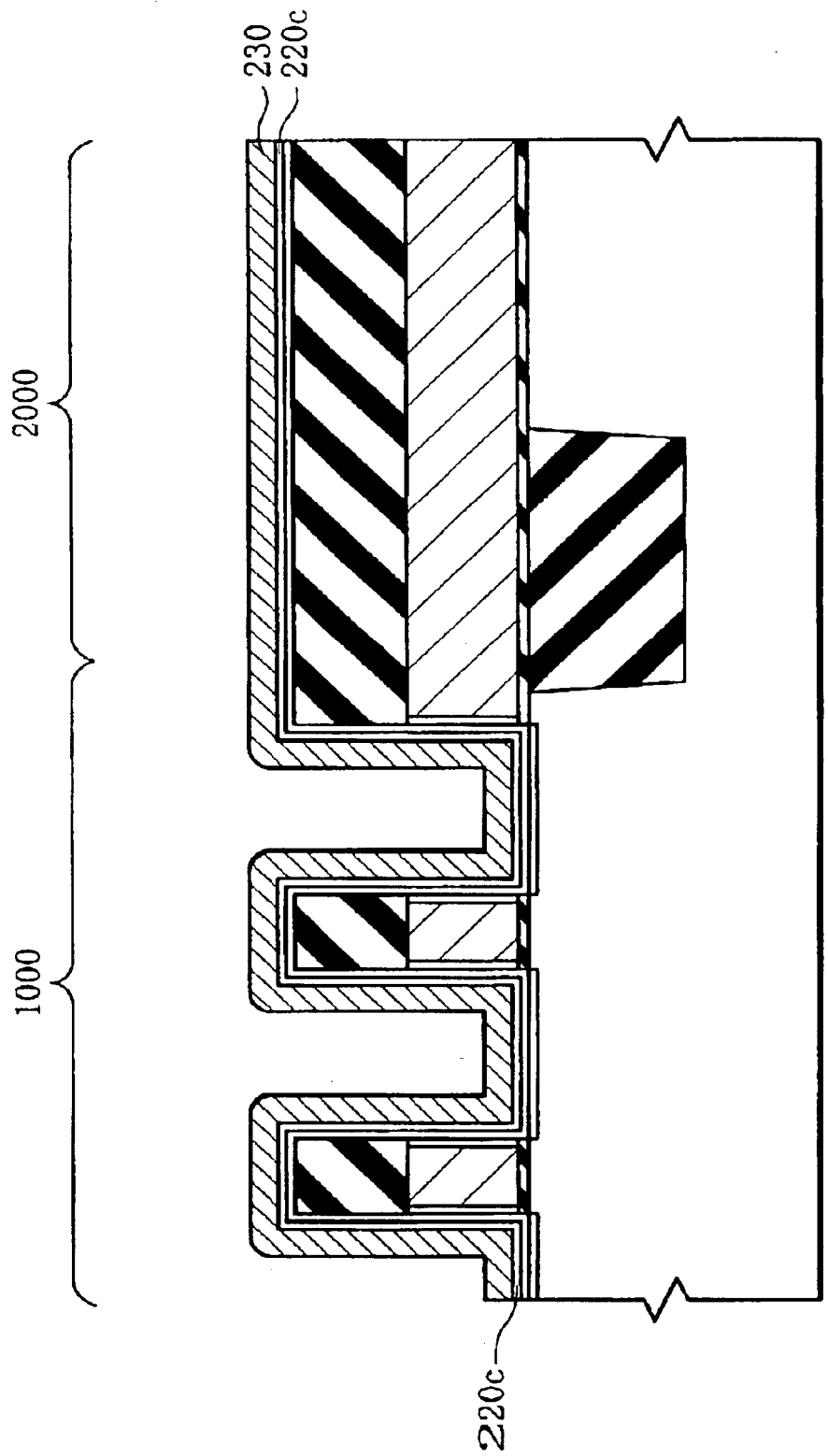
FIG. 7 is a diagram showing a process according to one embodiment of the present invention.

As shown in FIG. 7, a (e.g., second conductive) layer doped polysilicon 230 is formed on the second silicon oxide layer 220c. The doped polysilicon layer 230, etched later, becomes a conductive layer 40 from which are formed the control gates 20 and 30 (FIG. 1).

Figure 8:
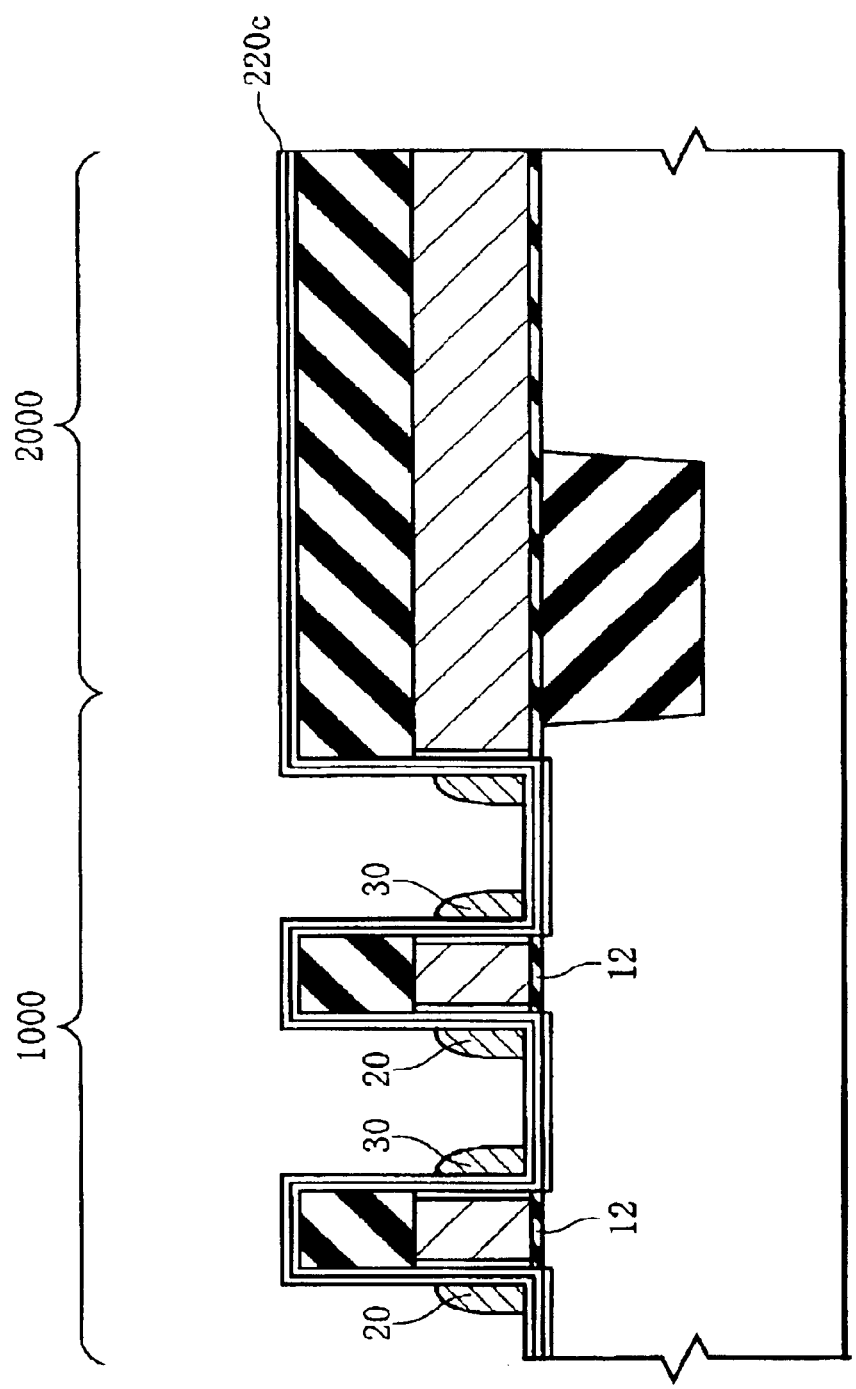
FIG. 8 is a diagram showing a process according to one embodiment of the present invention.

Subsequently, the doped polysilicon layer 230 is subjected to etching, e.g., anisotropic etching. Thereby, as shown in FIG. 8, along side surfaces of the openings 160 and 180 in the memory region 1000 (FIG. 5), the first and second control gates 20 and 30 are formed. Here, as shown in FIG. 8, the control gates 20 and 30 being formed are subjected to anisotropic etching until top surfaces thereof become lower in height than a top surface of the gate layer 140a. By carrying this out, at least, the first silicon oxide layer 220a is interposed between each of the top surfaces of the subsequently-formed control gates 20 and 30 and the top surface of the gate layer 140a. Accordingly, even when the silicide layer 292 is later formed partially on the surfaces of the control gates, the control gates 20 and 30 are not electrically connected with the word gate 14a.

The doped polysilicon layer 230 deposited in the logic circuit region 2000, except for the remaining portions representing the control gates 20 and 30, is substantially removed in this stage.

Figure 9:
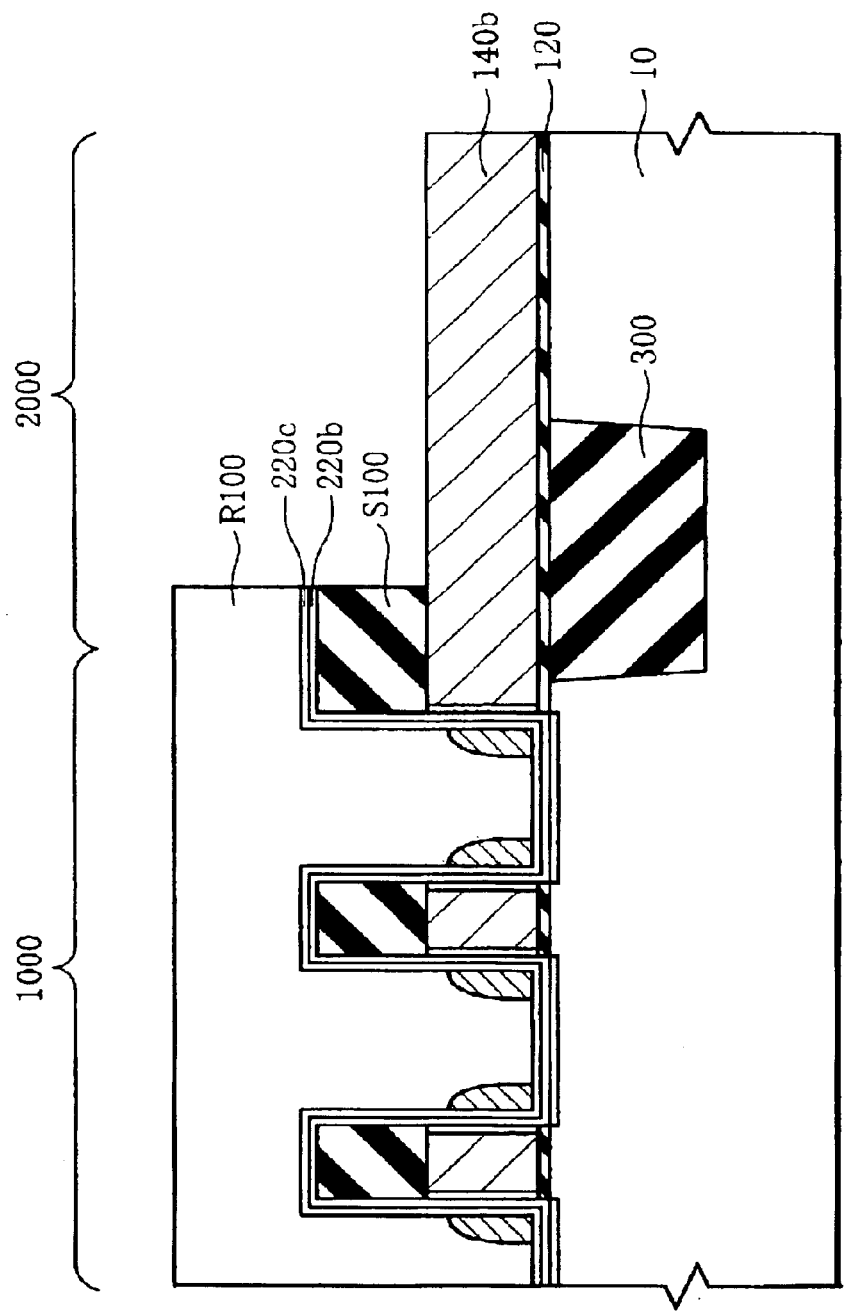
FIG. 9 is a diagram showing a process according to one embodiment of the present invention.

As shown in FIG. 9, a resist layer R100 that covers an entirety of the memory region 1000 and extends partially to the logic circuit region 2000 is formed. Subsequently, with the resist layer R100 as a mask, the second silicon oxide layer 220c, the silicon nitride layer 220b and the stopper layer S100 in the logic circuit region 2000 are removed, e.g., via etching. By this etching process, the stopper layer S100 in the logic circuit region 2000 also is removed. Thereafter, the resist layer R100 is removed.

Figure 10:
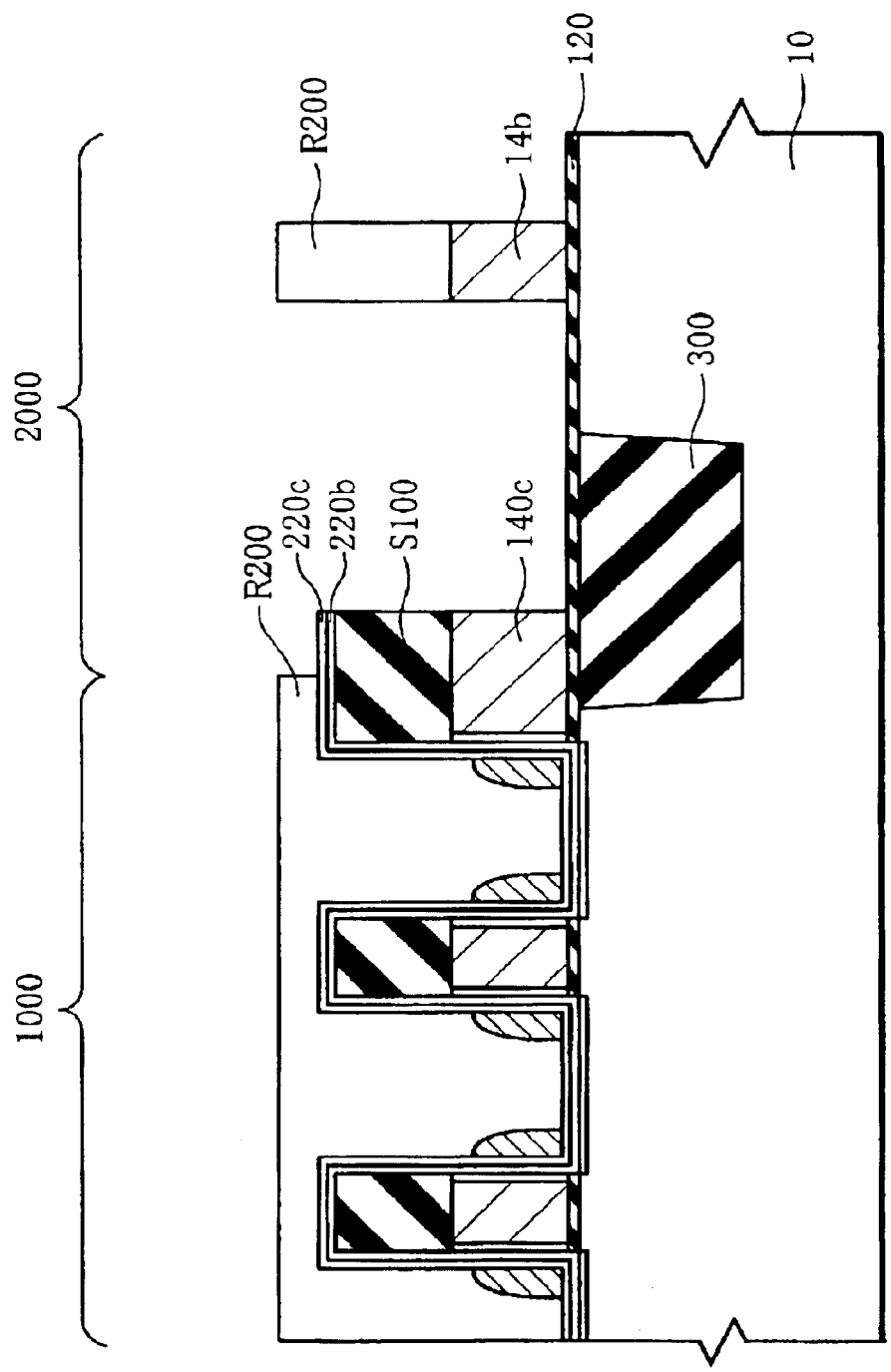
FIG. 10 is a diagram showing a process according to one embodiment of the present invention.

As shown in FIG. 10, a resist layer R200 is formed to form the gate electrode 14b. The resist layer R200 is patterned so as to cover the memory region 1000. Subsequently, using the resist layer R200 as a mask, the gate layer 140b is etched, and thereby the gate electrode 14b is formed in the logic circuit region 2000. Thereafter, the resist layer R200 is removed.

Figure 11:
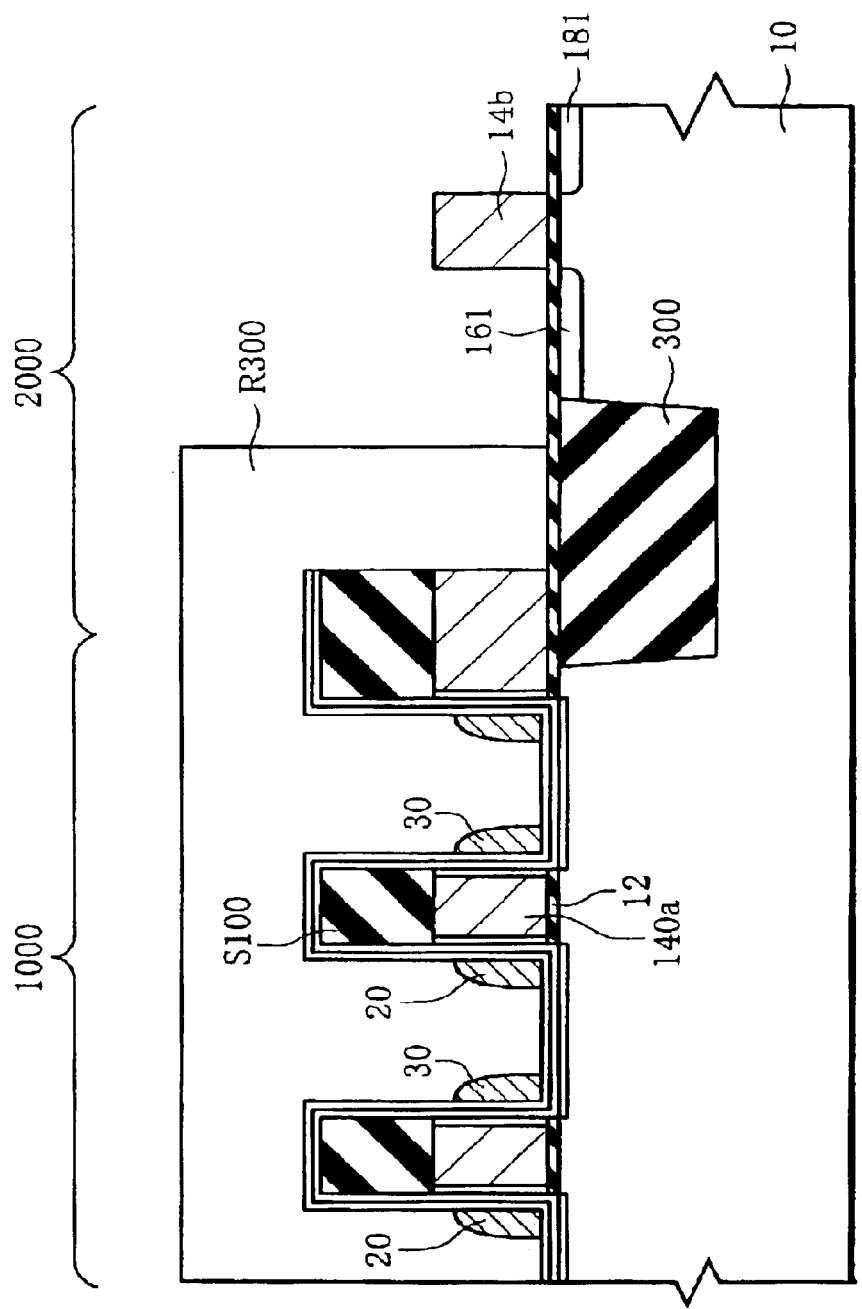
FIG. 11 is a diagram showing a process according to one embodiment of the present invention.

Then, as shown in FIG. 11, a resist layer R300 that covers and extends aside the memory region 1000 is formed. With the resist layer R300 as a mask, an impurity (e.g., N type), for example, is doped in a N-channel transistor portion. Thereby, in the logic circuit region 2000, extension layers 161 and 181 of the source region and the drain region are formed. Thereafter, the resist layer R300 is removed. Subsequently, e.g., with hydrofluoric acid, a surface of the semiconductor substrate is cleaned. Thereby, exposed portions of the insulating layer 120 and the second silicon oxide layer 220c, respectively, are removed.

Figure 12:
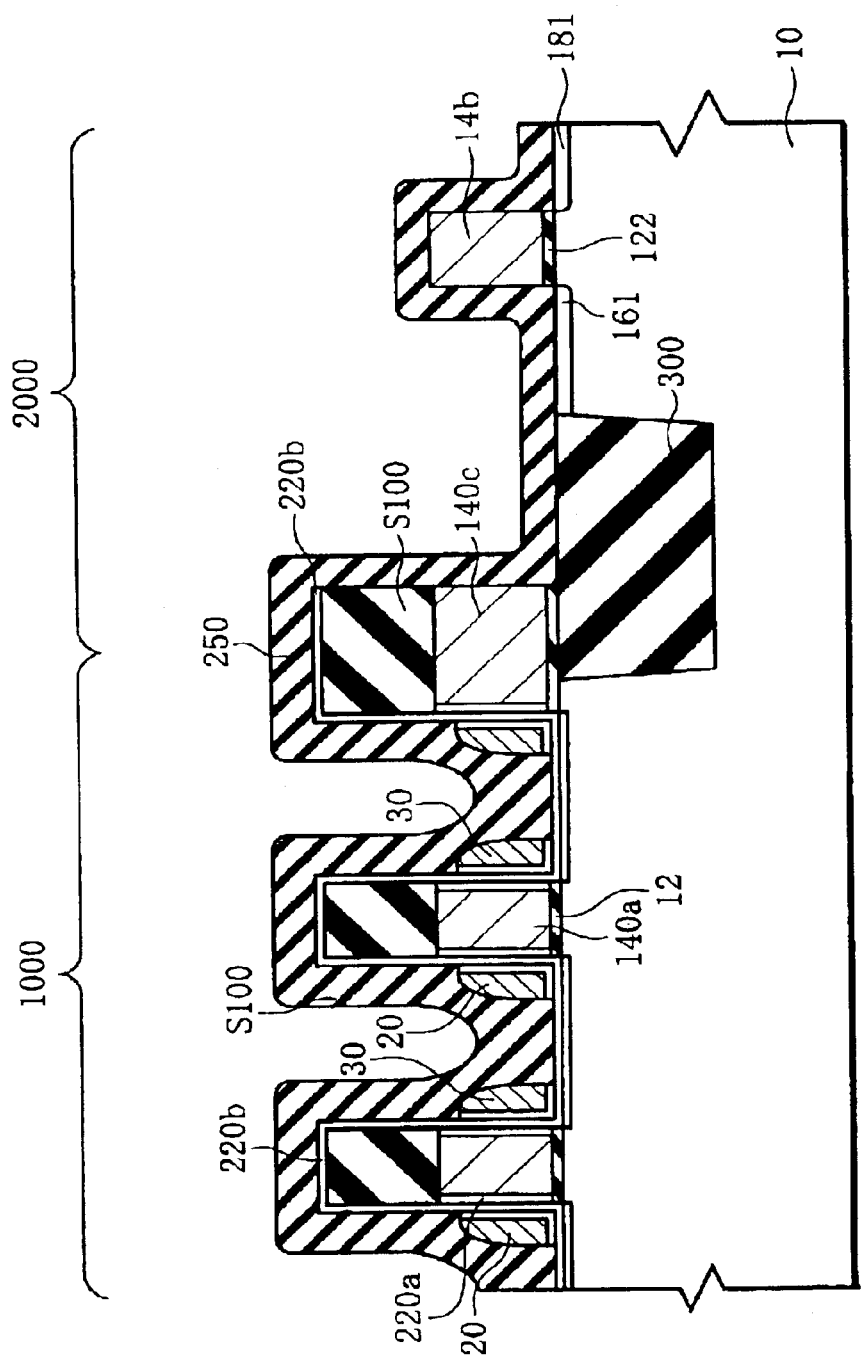
FIG. 12 is a diagram showing a process according to one embodiment of the present invention.

As shown in FIG. 12, in the memory region 1000 and the logic circuit region 2000, a second insulating layer 250 made of silicon oxide or silicon oxide nitride, is formed over an entire surface.

Figure 13:
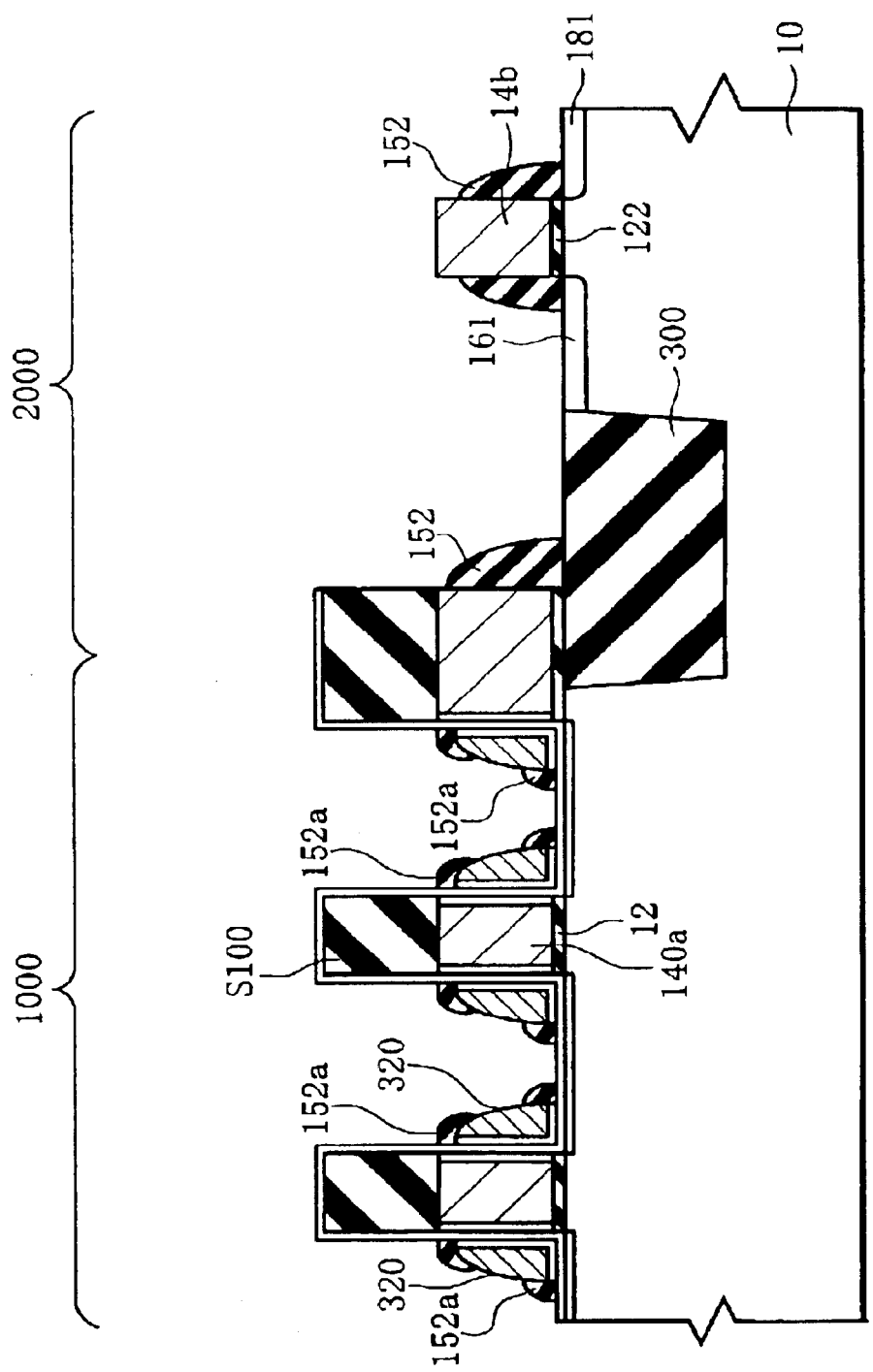
FIG. 13 is a diagram showing a process according to one embodiment of the present invention.

As shown in FIG. 13, the second insulating layer 250 (FIG. 12) is etched, e.g., anisotropically etched, and thereby in the logic circuit region 2000, sidewall insulating layers 152 are formed on both side surfaces of the gate electrode 14b. Furthermore, in a surface that does not face the semiconductor substrate 10 nor the gate layer 140a of each of the control gates 20 and 30, portions of the second insulating layer 250 remain in the neighborhood of the semiconductor substrate 10 and in the neighborhood of a top region of the gate layer 140a, and the other portions of the control gates 20 and 30 are exposed. That is, as shown in FIG. 13, portions of upper surfaces of the control gates 20 and 30 are exposed, referred to hereafter as exposed surfaces 320. On the exposed surfaces 320, in a subsequent process, a silicide layer 292 can be formed (see FIG. 14). The portions of the second insulating layer 250 that remain on the control gate 20, 30 will be called an insulating layer 152a. Furthermore, by continued or additional etching, portions of the insulating layers 220a and 220b (located on a region where a suicide layer formed in a subsequent process) are removed, and thereby portions of the semiconductor substrate are exposed.

Figure 14:
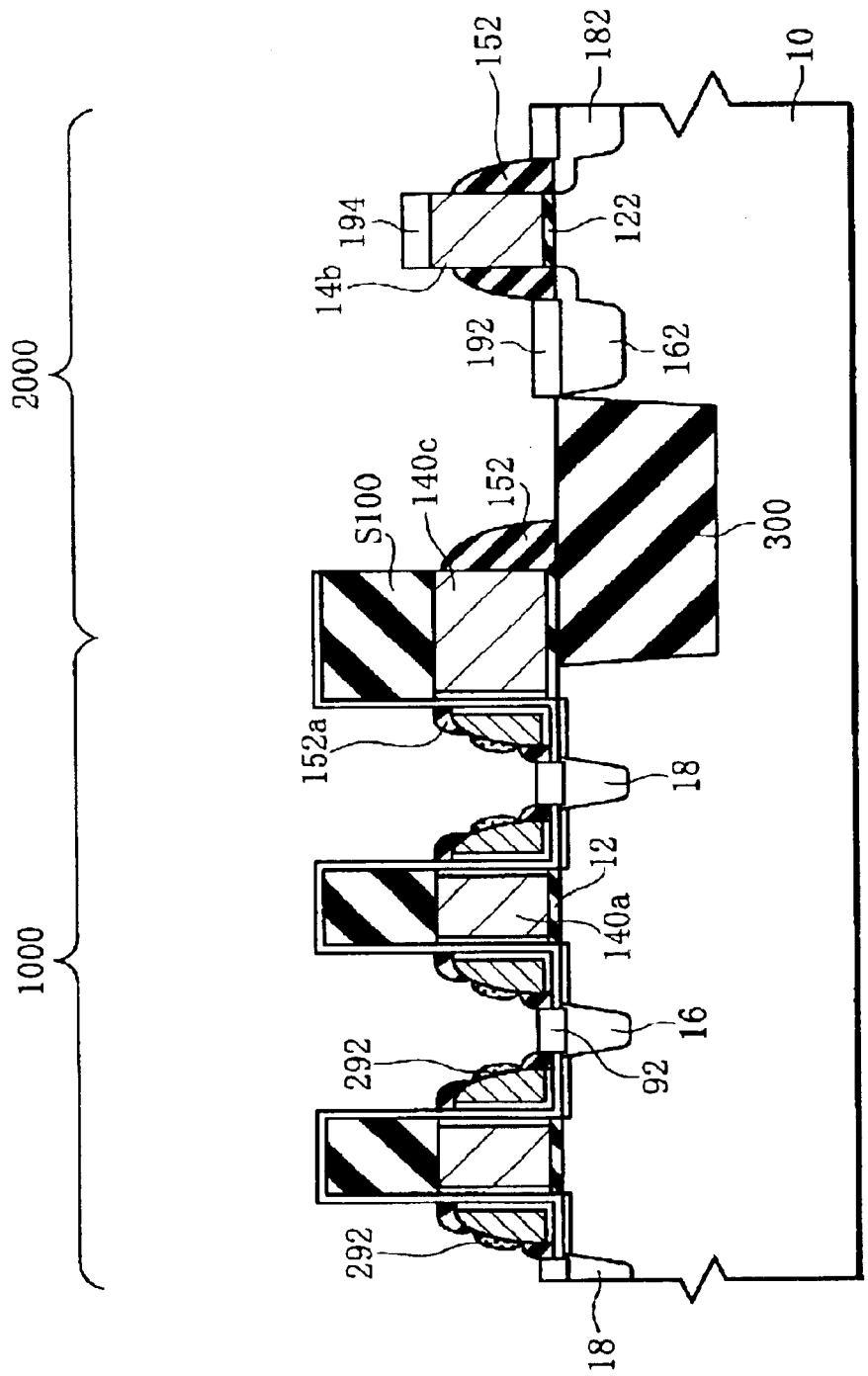
FIG. 14 is a diagram showing a process according to one embodiment of the present invention.

Subsequently, as shown in FIG. 14, an impurity, e.g., N type, is ion implanted. Thereby, inside of the semiconductor substrate 10, impurity regions 16 and 18 that are to become at least one of a source region and a drain region (hereinafter referred to as "source/drain regions") of the memory region 1000, and impurity regions 162 and 182 corresponding to source/drain regions of the logic circuit region 2000 are formed.

Next, a metal for use in the formation of silicide can be deposited. The metal is for use in the formation of silicide and can be, for instance, titanium or cobalt. Thereafter, the metal formed on the impurity regions 16, 18, 162 and 182, the exposed surfaces 320 of the control gates 20 and 30, and the gate electrode 14b is subjected to a silicide reaction. By this process, as shown in FIG. 14, a suicide layer 92 is formed on top surfaces of the impurity region 16 and 18, a silicide layer 292 is formed on the exposed surfaces 320 of the control gates 20 and 30, a silicide layer 192 is formed on a top surface of the impurity regions 162 and 182, and a silicide layer 194 is formed on a top surface of the gate electrode 14b. Accordingly, one silicide process can generate silicide on all of the top surfaces of the impurity regions 16, 18, 162, and 182, the exposed surfaces of the control gates 20 and 30, and the top surface of the gate electrode 14b.

Figure 15:
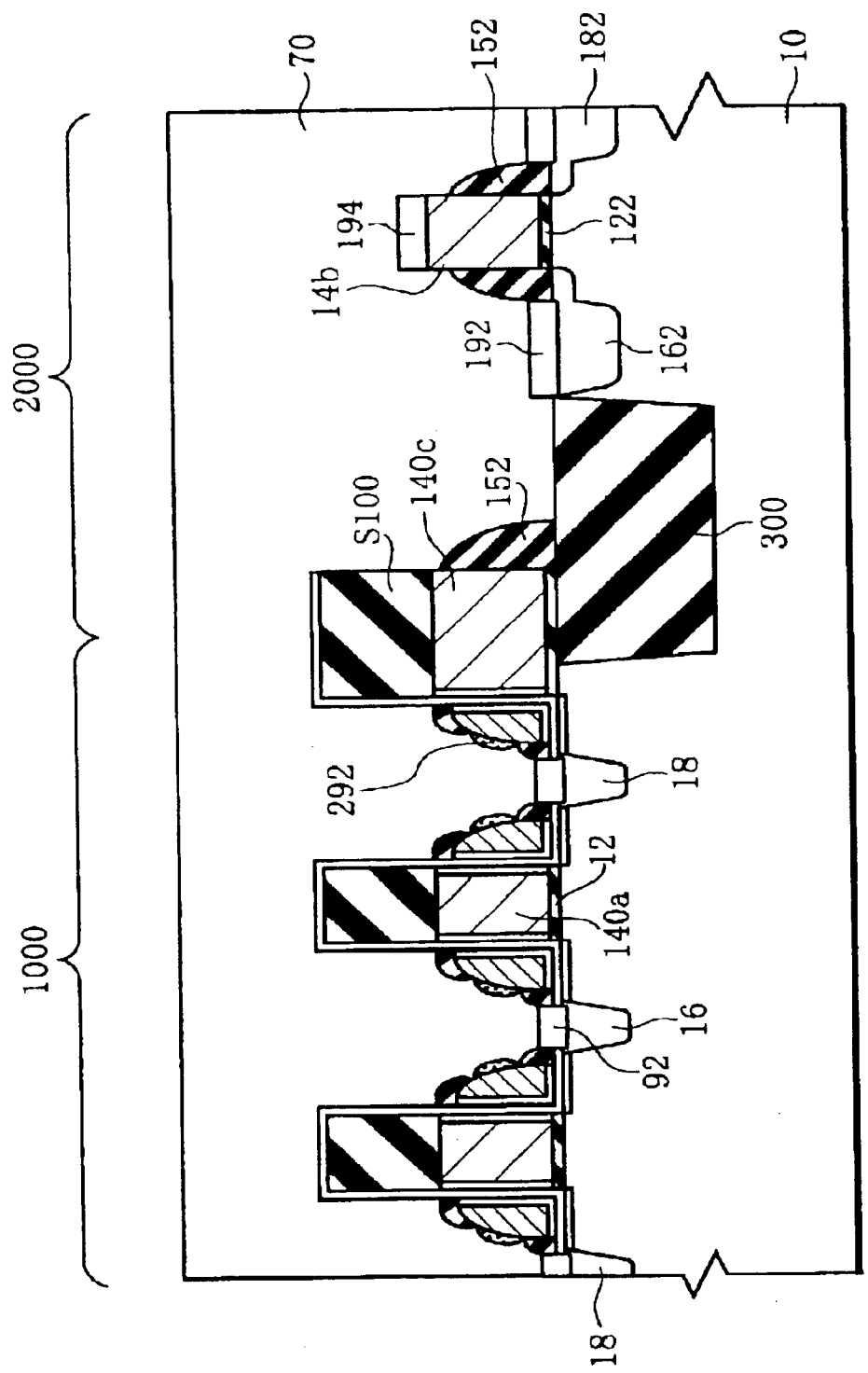
FIG. 15 is a diagram showing a process according to one embodiment of the present invention.

Subsequently, as shown in FIG. 15, in the memory region 1000 and the logic circuit region 2000, a third insulating layer 70 such as silicon oxide or silicon nitride oxide is formed over an entire surface, particularly so as to cover the stopper layer S100.

Figure 16:
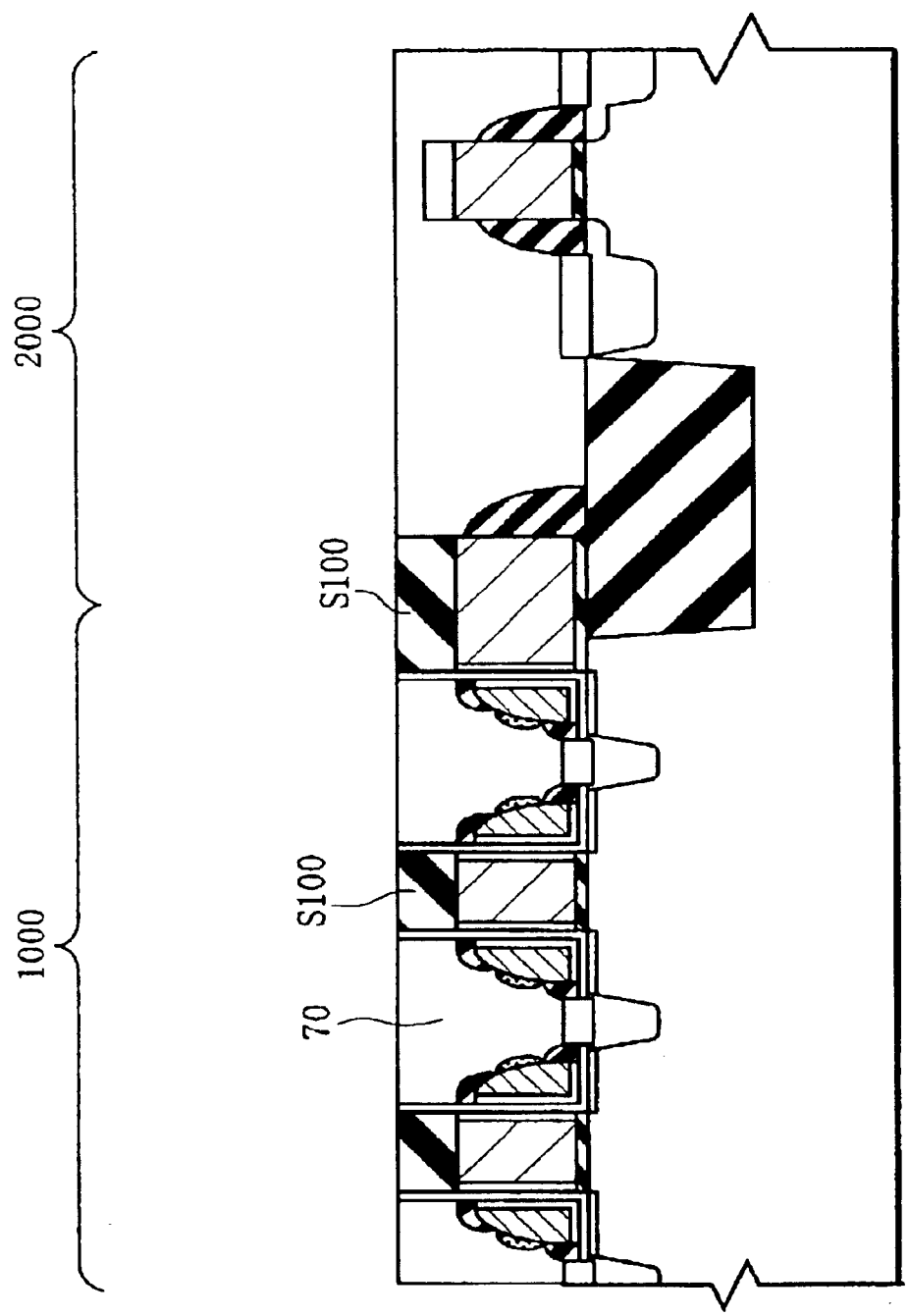
FIG. 16 is a diagram showing a process according to one embodiment of the present invention.

As shown in FIG. 16, the third insulating layer 70 is removed, e.g., polished by use of a CMP method, until the stopper layer S100 is exposed, and thereby the third insulating layer 70 is planarized. After the polishing, the third insulating layer 70 remains between two side insulating layers 24 that face each other with the control gates 20, 30 between them. At this time, the MOS transistor 500 is completely covered with the third insulating layer 70.

The stopper layer S100 is removed, e.g., hot phosphoric acid treatment or dry etching. As a result, at least a top surface of the gate layer 140a is exposed. Thereafter, a layer (that can become a word line), for instance, a doped silicon layer or a metal layer made of TiN or W, is deposited over an entire surface. Here, it is assumed the doped polysilicon layer is deposited.

Figure 17:
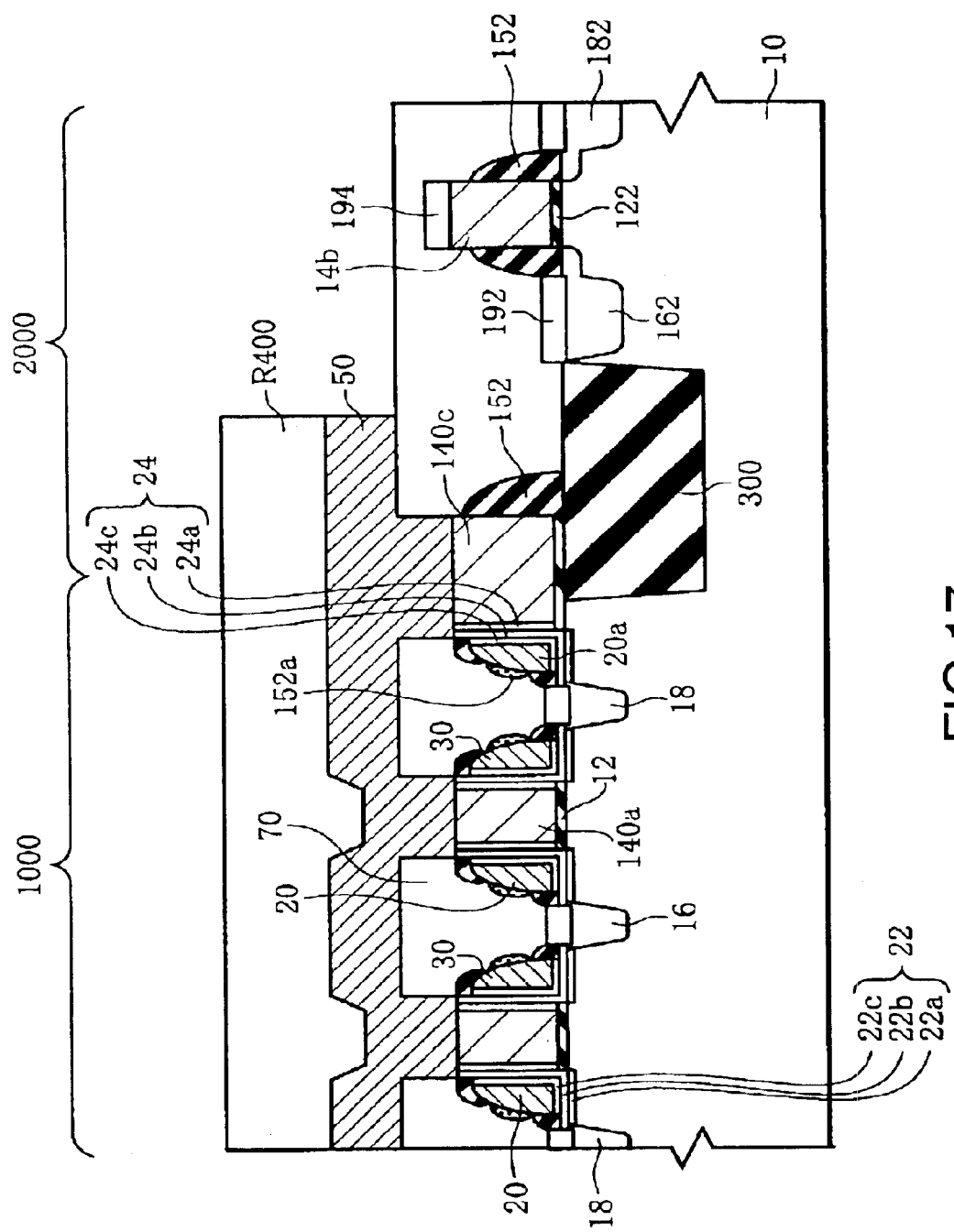
FIG. 17 is a diagram showing a process according to one embodiment of the present invention.
Figure 18:
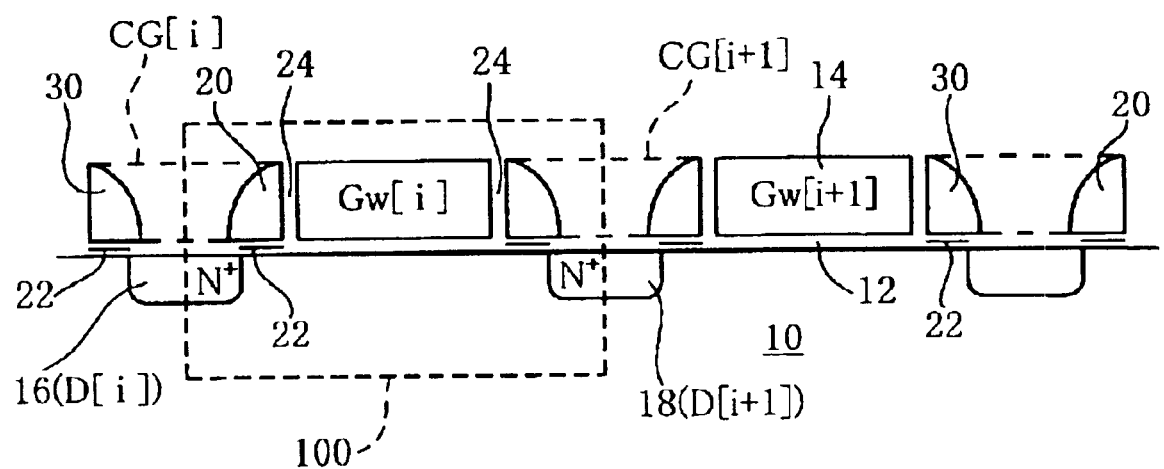
FIG. 18 is a cross sectional view showing a known MONOS type memory cell.

Subsequently, as shown in FIG. 17, on the doped polysilicon layer, a patterned resist layer R400 is formed. With the resist layer R400 as a mask, the doped polysilicon layer is patterned, and thereby a word line 50 is formed.

Subsequently, with the resist layer R400 as a mask, the gate layer 140a is etched. By the etching, portions of the gate layer 140a not lying underneath the word line 50 are removed. As a result, the word gates 14a arranged in array can be formed. Regions located under the removed portions of the gate layer 140a can subsequently be formed into impurity regions (for use in element isolation) 15 (see FIG. 1).

In the etching process, the conductive layer 40 (that forms the first and second control gates 20 and 30) remains covered with the third insulating layer 70, and so does not get etched. Furthermore, the MOS transistor 500 in the logic circuit region 2000, being completely covered with the third insulating layer 70, is not affected by the etching.

Next, an impurity, e.g., P type, is doped over an entire surface of the semiconductor substrate 10. Thereby, in a region between the word gates 14a in a Y direction, an impurity, e.g., P type, region (impurity region for use in element isolation) 15 (FIG. 1) is formed. With the P type impurity region 15, the element isolation between nonvolatile semiconductor memory devices 100 can be assuredly implemented.

According to the above processes, the semiconductor device shown in FIGS. 1 and 2 can be fabricated.

In the above, one mode for implementing the present invention is described. However, the present invention is not restricted to the above, and within the scopes of the present invention various modes can be taken. For instance, in the above mode for implementing the invention, although a bulk semiconductor substrate is used as a semiconductor layer, a semiconductor layer of an SOI substrate may be used.

Some advantages of such fabricating methods include the following.

Firstly, the silicide layer 292 can be formed on the surfaces of the control gates 20 and 30. Thereby, the control gate can be made low in resistance.

Secondly, the second insulating layer 250 is anisotropically etched so that portions 152a of the insulating layer may remain in the neighborhood of the semiconductor substrate 10 and in the neighborhood of a top surface of the gate layer 140a. Thereby, the control gates 20 and 30 are hindered from coming into contact with the impurity diffusion layers 16 and 18, and the word gate 14a, thus preventing short-circuiting.

Thirdly, the process for forming the silicide layer 292 on the exposed surface of the control gates 20 and 30, and the process for forming the silicide layer 92 on the top surfaces of the impurity regions 16 and 18, the process for forming the silicide layer 192 on the top surfaces of the impurity regions 162 and 182, and the process for forming the silicide layer 194 on the top surface of the gate electrode 142 can be implemented in the same process.

The invention may be embodied in other forms without departing from its spirit and essential characteristics. The described embodiments are to be considered only non-limiting examples of the invention. The scope of the invention is to be measured by the appended claims. All changes which come within the meaning and equivalency of the claims are to be embraced within their scope.

The entire disclosure of Japanese Patent Application No. 2002-059146 filed Mar. 5, 2002 is incorporated by reference herein.

What is claimed is:

1. A method for fabricating a nonvolatile memory device, the method comprising:

forming a first insulating layer above a semiconductor layer;

forming a first conductive layer above the first insulating layer;

forming a stopper layer above the first conductive layer;

patterning the stopper layer and the first conductive layer;

forming an ONO film above the semiconductor layer and on both side surfaces of the first conductive layer;

forming a second conductive layer above the ONO film;

etching back the second conductive layer using an anisotropic etching, and thereby forming sidewall control gates on both side surfaces of the first conductive layer, with the ONO film being interposed therebetween;

forming a second insulating layer above the control gate;

etching back the second insulating layer using an anisotropic etching, and thereby at least partially exposing the control gates;

forming source/drain regions in the semiconductor layer;

forming a silicide layer on the source/drain regions and an exposed surface of the control gates resulting in an intermediate structure;

forming a third insulating layer over the intermediate structure;

polishing the third insulating layer so as to expose the stopper layer;

removing the stopper layer; and patterning the first conductive layer and thereby forming a word gate.

2. A method for fabricating a semiconductor device having a memory region including a nonvolatile memory device; and a logic circuit region including a peripheral circuit of the nonvolatile memory device, the method comprising:

forming a first insulating layer above a semiconductor layer;

forming a first conductive layer above the first insulating layer;

forming a stopper layer above the first conductive layer;

patterning the stopper layer and the first conductive layer in the memory region;

forming an ONO film above the semiconductor layer and on both side surfaces of the first conductive layer in the memory region;

forming a second conductive layer above the ONO film;

etching back the second conductive layer using an anisotropic etching, and thereby forming sidewall control gates at least on both side surfaces of the first conductive layer in the memory region, the ONO film being interposed therebetween;

removing the stopper layer in the logic circuit region;

patterning the first conductive layer in the logic circuit region, and thereby forming a gate electrode for use in an insulated gate field effect transistor in the logic circuit region;

forming a second insulating layer above an entire surface of the semiconductor layer;

etching back the second insulating layer using an anisotropic etching, and thereby at least partially exposing the control gates and also thereby forming a sidewall insulating layer at least on both side surfaces of the gate electrode;

forming first source/drain regions for use in the nonvolatile memory device, and second source/drain regions for use in the insulated gate field effect transistor;

forming portions of a silicide layer on the first and second source/drain regions, the gate electrode, and exposed surfaces of the control gates resulting in an intermediate structure;

forming a third insulating layer over the intermediate structure;

polishing the third insulating layer so that the stopper layer in the memory region is exposed but the gate electrode in the logic circuit region is not exposed;

removing the stopper layer in the memory region; and patterning the first conductive layer in the memory region, and thereby forming a word gate of the nonvolatile memory device in the memory region.

3. The method of claim 1, further comprising:

forming an isolation region in the substrate between the memory region and the logic circuit region.

4. A method of making a nonvolatile memory device, the method comprising:

providing a semiconductor substrate;

forming a first insulating layer above the substrate;

forming a first conductive layer above the first insulating layer;

forming a stopper layer above the first conductive layer;

selectively removing portions of the stopper layer and the first conductive layer to form stacked arrangements of a first gate layer and an etch stop segment resulting in a first intermediate structure;

forming an ONO-type film structure above the first intermediate structure;

forming a second conductive layer above the ONO-type film structure;

selectively removing portions of the second conductive layer and the ONO-type film structure to form sidewall control gates aside the first gate layers, resulting in a second intermediate structure;

forming a third insulating layer on the second intermediate structure;

removing portions of the second insulating layer to expose central regions of the sidewall control gates;

forming source/drain regions in the substrate between the sidewall control gates;

forming a silicide layer on the exposed central regions of the sidewall control gates and on source/drain regions of the substrate, resulting in a third intermediate structure;

forming a third insulating layer on the third intermediate structure;

removing portions of the third insulating layer until the etch stop segments are exposed;

substantially removing the etch stop segments; and patterning remaining portions of the first conductive layer to form a word gate.

5. The method of claim 4, wherein the ONO-type film structure further comprises a SONOS variety of the ONO-type structure.

6. The method of claim 4, wherein the anisotropically removing of the portions of the third insulating layer further comprises CMP.

7. The method of claim 4, wherein
the ONO-type film structure includes a first oxide layer, a second nitride layer in part on the first oxide layer and a third oxide layer on the second nitride layer,
the second layer being formed, also in part, directly in contact with the etch stop segments.

* * * * *

UNITED STATES PATENT AND TRADEMARK OFFICE
CERTIFICATE OF CORRECTION

PATENT NO.        : 7,087,487 B2                                      Page 1 of 1
APPLICATION NO.   : 10/378589
DATED             : August 8, 2006
INVENTOR(S)       : Katsumi Mori It is certified that error appears in the above-identified patent and that said Letters Patent is hereby corrected as shown below:

Title Page, #56 References Cited, Foreign Patent Documents: Insert

-- JP 2002-289715  10/2002
JP 2001-007046  1/2001
JP 2001-148434  5/2001
JP 01-239956  9/1989 --

Col. 8, line 55: "suicide" should be -- silicide --.

Col. 9, line 5: "suicide" should be -- silicide --.

Signed and Sealed this

Sixth Day of March, 2007

JON W. DUDAS
*Director of the United States Patent and Trademark Office*